United States Patent [19]

Miyagawa

[11] Patent Number: 4,955,808

[45] Date of Patent: Sep. 11, 1990

[54] METHOD OF HEAT-PROCESSING OBJECTS AND DEVICE AND BOAT FOR THE SAME

[75] Inventor: Kazuhisa Miyagawa, Shiroyama, Japan

[73] Assignee: Tel Sagami Limited, Kanagawa, Japan

[21] Appl. No.: 321,267

[22] Filed: Mar. 9, 1989

[30] Foreign Application Priority Data

Mar. 9, 1988 [JP]  Japan ................................. 63-55730

[51] Int. Cl.$^5$ ............................................. F27D 3/00
[52] U.S. Cl. ......................................... 432/5; 432/6; 432/123; 432/253
[58] Field of Search ................. 432/5, 6, 11, 152, 253, 432/259, 239

[56] References Cited

U.S. PATENT DOCUMENTS

| | | | |
|---|---|---|---|
| 4,459,104 | 7/1984 | Wollmann | 432/239 |
| 4,526,534 | 7/1984 | Wollmann | 432/26 |
| 4,543,059 | 9/1985 | Whang et al. | 432/123 |
| 4,610,628 | 9/1986 | Mizushina | 432/253 |
| 4,651,441 | 3/1987 | Daetwyler | 432/5 |

Primary Examiner—Henry C. Yuen
Attorney, Agent, or Firm—Oblon, Spivak, McClelland, Maier & Neustadt

[57] ABSTRACT

A method of heat-processing semiconductor wafers comprising forming a purge tube which encloses the plural wafers by supporting a boat, on which the plural wafers are mounted, by a carrier arm to define a space on the upper side of the wafers while defining another space on the lower side of the wafers when the boat is to be loaded into and unloaded from a heat process furnace by the moving carrier arm or either when the boat is to be loaded into the heat process furnace or when it is to be unloaded from the heat process furnace, moving the carrier arm to communicate the purge tube with the heat process furnace, supplying nitrogen gas into both of the purge tube and the heat process furnace, keeping them connected to each other, pre-heating or cooling the wafers to a predetermined temperature range, and loading the purge tube into the heat process furnace or unloading the purge tube from the heat process furnace.

5 Claims, 7 Drawing Sheets

FIG. 5A  STEP 1: SET CARRIER ARM

FIG. 5B  STEP 2: SET BOAT

FIG. 5C  STEP 3: MOVE BOAT; SUPPLY N2 GAS

FIG. 5D  STEP 4: OPEN GATE VALVE

FIG. 5E  STEP 5: PREHEAT WAFERS SUPPLY N2 GAS

FIG. 5F  STEP 6: MOVE BOAT TO FURNACE

FIG. 5G  STEP 7: LAND BOAT

FIG. 5H  STEP 8: RETRACT CARRIER ARM

FIG. 5I  STEP 9: CLOSE GATE VALVE

FIG. 5J  STEP 10: MOVE CARRIER TO HOME POSITION

METHOD OF HEAT-PROCESSING OBJECTS AND DEVICE AND BOAT FOR THE SAME

BACKGROUND OF THE INVENTION

1. Field of the Invention

The present invention relates to a method and a device for heat-processing a plurality of semiconductor wafers while preventing them from being oxidized. The present invention also relates to a boat for use with the heat process device.

2. Description of the Related Art

Semiconductor devices such as IC and LSI are manufactured after wafers cut from ingot are subjected to various process such as surface machining, heat oxidizing, impurity diffusing, film depositing and etching. The semiconductor wafers are heat-processed several times int eh course of these various processes.

In the film depositing process, for example, the semiconductor wafers are mounted on boats made of quartz, loaded into process tubes in diffusion furnaces and reacted with process gas under high temperature. A lot of wafers mounted on a boat usually reaches up to 200 pieces.

When the boat is loaded and unloaded into and out of the process tube in the diffusion furnace, an exclusive fork made of quartz is used. Systems for driving the fork in this manner are of the cantilever and soft landing types. In the case of the cantilever system, the fork is inserted into the process tube while keeping the boat not to contact the process tube and heat process is conducted while supporting the boat by the fork. In the case of the soft landing system, the boat is soft landed into the process tube from the fork, the fork is kept outside the furnace while heat process is being conducted, and the fork is again inserted into the furnace to carry the boat out of the furnace after heat process is finished.

Before the boat is loaded into the furnace, the furnace is filled with non-oxidizable gas such as nitrogen gas to prevent the wafers from being oxidized. Whichever of the cantilever and soft landing systems may be employed, air enters into the furnace, when the fork is inserted into and released from the furnace, to thereby cause unnecessary oxide film to be formed on the surface of each of the wafers. This is quite undesirable.

Figure 1:
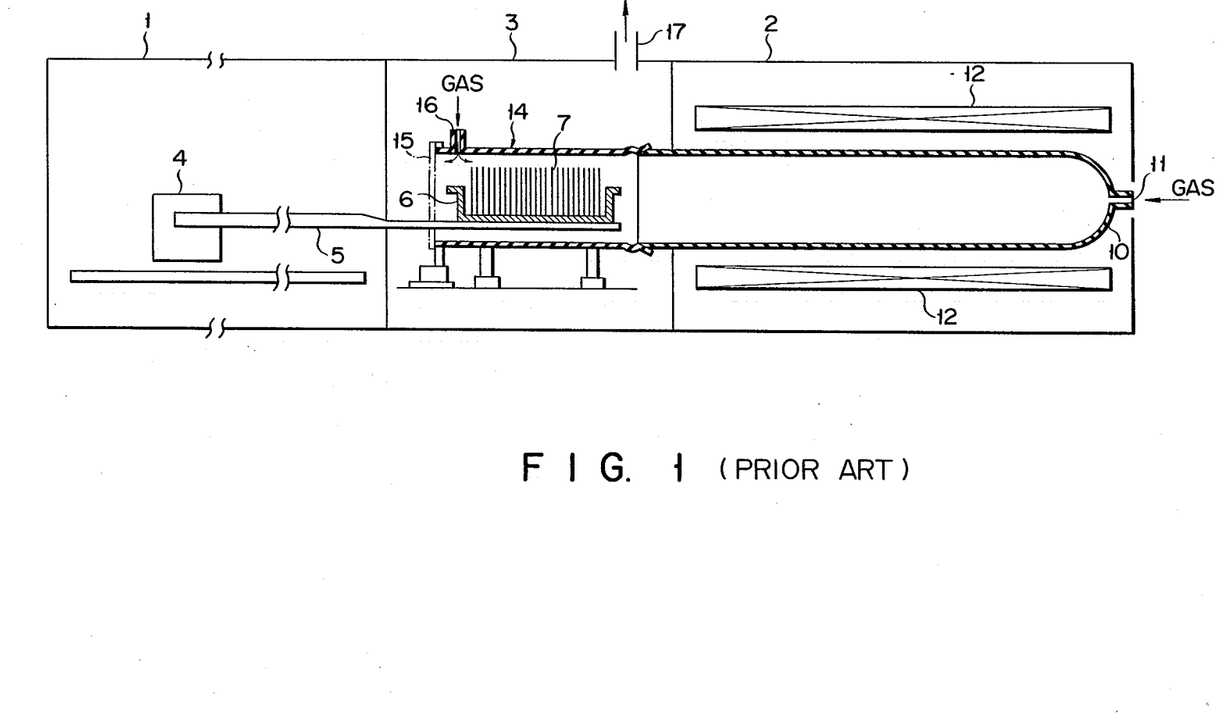
FIG. 1 is a vertically sectioned view showing the conventional heat process device.

In the case of the conventional heat process device as shown in FIG. 1, therefore, scavenger 3 is located between loading/unloading unit 1 and heat process furnace 2 and boat 6 is inserted into and released from process tube 10 in the furnace through auxiliary air-tight tube (so-called elephant tube) 14 in scavenger 3. Heater 12 is located around process tube 10 to heat wafers in tube 10. Process tube 10 and auxiliary air-tight tube 14 are air-tightly connected to each other and process or nitrogen gas is introduced into tube 10 through inlet 11 while nitrogen gas into tube 14 through inlet 16. Shutter 15 is located at the open end of auxiliary air-tight tube 14 and boat 6 is inserted into and released from auxiliary air-tight tube 14 by means of fork 5 at soft landing section 4 while closing and opening the open end of auxiliary air-tight tube 14 by shutter 15.

In the case of this heat process device, gas in scavenger 3 is previously exhausted through outlet 17 and nitrogen gas is introduced into auxiliary air-tight tube 14 through inlet 16. This efficiently prevents air from entering into process tube 10.

However, auxiliary air-tight tube 14 is made continuous from and communicated with process tube 10 with no partition wall interposed between them. Therefore all of the air cannot be eliminated from auxiliary air-tight tube 14, thereby allowing air to enter into process tube 10. This causes wafers 7 to be oxidized in the furnace, preventing desired film from being formed on the surface of each of wafers 7.

This problem is also caused when boat 6 is unloaded from furnace 2. When wafers 7 on which film has been formed are put outside immediately after the heat process, the film on wafers 7 is oxidized. Boat 6 must be therefore unloaded outside the furnace after wafers 7 are gas-cooled to a temperature under which no oxide film is formed on the surface of each of wafers 7. In the case of the conventional heat process device, however, wafers 7 are over-oxidized while boat 6 is still stayed in auxiliary air-tight tube 14.

Preliminary-opened Japanese Patent Application No. Sho 61-190929 discloses a device for preventing the wafers from being oxidized in the heat process. This device is of the fixed air shielding type but cannot sufficiently prevent the wafers from being oxidized.

SUMMARY OF THE INVENTION

An object of the present invention is to provide a method and device for heat-processing semiconductor wafers capable of removing unnecessary gas such as air present in a space enclosing a boat on which the semiconductor wafers are mounted and in a heat process furnace before and after or either before or after the semiconductor wafers are heat-processed, and also capable of filling these spaces with an atmosphere of non-oxidizable gas to prevent undesirable oxide film and the like from being formed on the surface of each of the semiconductor wafers.

Another object of the present invention is to provide a boat for use with the heat process device wherein the boat itself is used as a part of the member for defining the space around semiconductor wafers when the boat is loaded into and unloaded from the furnace to efficiently prevent the wafers from being oxidized when the boat is loaded and unloaded relative to the furnace.

According to an aspect of the present invention, there can be provided a method of heat-processing semiconductor wafers comprising forming a cylindrical purge tube by supporting a boat, on which the plural wafers are mounted, by a carrier arm means to define a space on the upper side of the wafers by the carrier arm means while defining another space on the lower side of the wafers by the boat itself before and after or either before or after the boat means is to be loaded into and unloaded from a heat process furnace means by the moving carrier arm means; moving the carrier arm means to communicate the purge tube with the heat process furnace; supplying non-oxidizable gas into both of the purge tube and the heat process furnace, keeping them communicated with each other; and loading or unloading the purge tube into or from the heat process furnace after the purge tube and the heat process furnace are filled with non-oxidizable gas.

It is preferable in this case that a partition means is located between the purge tube and the heat process furnace and that after non-oxidizable gas is supplied into the purge tube and the heat process furnace while keeping them partitioned, the partition means is removed to communicate them with each other and non-oxidizable gas is further supplied into them while keeping them communicated.

The present invention also provides a device for heat-processing semiconductor wafers comprising a boat means for supporting the plural wafers to cover the lower side of the wafers and provided with engaged pieces or members; a carrier arm means supported like a cantilever to be inserted into and released from a heat process furnace and provided at the free end thereof with a cylindrical member and an upper arc member for covering the upper side of the wafers mounted on the boat and also provided at the upper arc member with engaging pieces or members with which the engaged pieces or members of the boat are engaged; a heat process furnace located at one end of a passage along which the carrier arm means is moved to apply heat process to the wafers to react with process gas when the wafers enclosed by the upper arc member and the boat are loaded in the furnace; a shielding means fitted onto the rod-like portion of the carrier arm means to be urged to shield the open end of the cylindrical member and also to shield the open end of the heat process furnace when the free end of the carrier arm means is inserted into the heat process furnace and a gas inlet provided at the shielding means to introduce non-oxidizable gas into the cylindrical member.

It is preferable in this case that a shutter is provided at the open end of the heat process furnace to open and close it. It is further preferable that a shutter guide member is provided with a guide groove for the shutter, a hole through which the purge tube is passed and gas inlets communicated with the guide groove and the purge tube passing hole to supply non-oxidizable gas into the heat process furnace.

The present invention also provides a boat for use with the heat process device comprising a member for holding wafers and a pair of end plates for supporting the wafers holder member at both end thereof wherein said wafers holder member is like a lower half of a hollow cylinder obtained when the cylinder is split along the longitudinal center axis thereof and wherein said wafers holder member is provided with engaged pieces or members which are engaged with the engaging pieces or members of the carrier arm means.

It is preferable that each of those parts which form the boat is made of quartz glass or silicon carbide.

It is also preferable that the purging non-oxidizable gas is nitrogen gas, argon gas, helium gas or the like.

According to the method of the present invention, the purge tube is formed by the carrier arm member and the boat to enclose semiconductor wafers therein and non-oxidizable gas is supplied into the purge tube and the heat process furnace to fill them with an atmosphere of non-oxidizable gas when the boat is to be loaded into or unloaded out of the heat process furnace. The semiconductor wafers are then carried from the scavenger into the heat process furnace or outside the scavenger together with the purge tube. This can prevent air from entering into the heat process furnace to form undesirable oxide film on the surface of each of the wafers when the wafers are loaded into the heat process furnace. In addition, it can be prevented that unnecessary oxide film is formed on the surface of each of the wafers before the wafers are carried out of the scavenger because the wafers which have been heated to high temperature are sufficiently cooled in an atmosphere of non-oxidizable gas in the purge tube.

According to the heat process device of the present invention, the engaged pieces of the boat are engaged with the engaging pieces of the carrier arm member to form the purge tube by which semiconductor wafers are enclosed. When the boat is located under the upper arc member at the front end of the carrier arm means and the carrier arm means is then moved in the longitudinal direction thereof by such a stroke that enables the engaged members of the boat to be engaged with the engaging members of the carrier arm means, the boat can be supported by the carrier arm means. The moving stroke of the carrier arm means in the longitudinal direction thereof can be thus made sufficiently shorter as compared with that of "Atom Scan" (trade name). This enables the device to be smaller-sized and the space, which the device occupies exclusively, to be reduced.

The shielding means having gas inlets serves to close one end of the purge tube which is formed by the carrier arm member and the boat and to introduce non-oxidizable gas into the purge tube when the carrier arm member is out of the heat process furnace.

In order to prevent heat from escaping from the heat process furnace while keeping the purge tube, which is formed by the carrier arm member and the boat, loaded in the furnace, the open end of the furnace must be closed. The shielding means also serves to close the open end of the furnace after the carrier arm member is inserted into the heat process furnace.

DETAILED DESCRIPTION OF THE PREFERRED EMBODIMENTS

Some embodiments of the present invention will be described referring to the accompanying drawings and citing only one of horizontal multideck furnaces.

Figure 2:
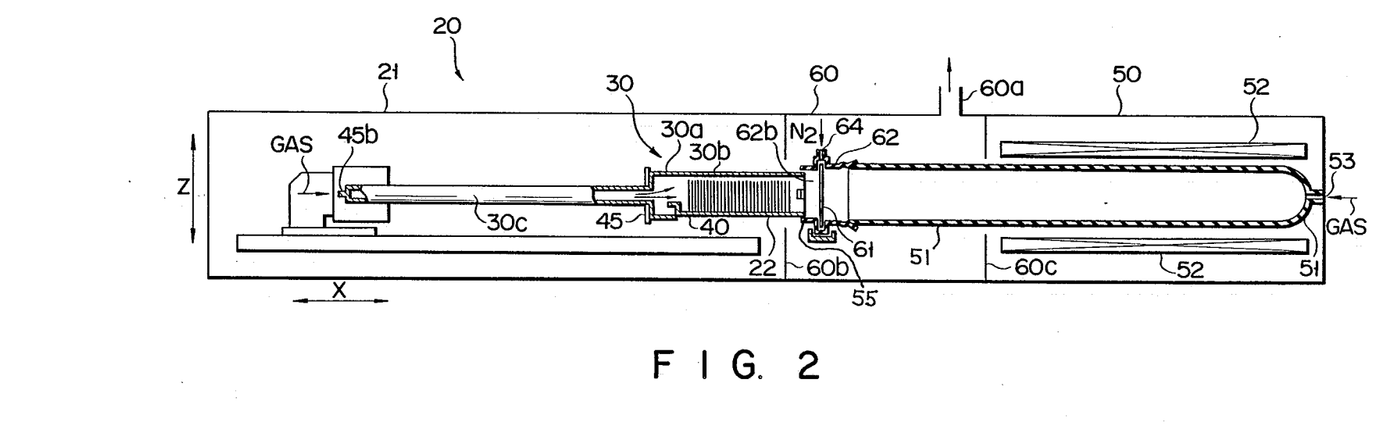
FIG. 2 is a vertically sectioned view showing an example of the heat process device according to the present invention.

Heat-processing device 20 is arranged in each of the horizontal multideck furnaces. Loading/unloading unit 21, scavenger 60 and heat-processing furnace 50 are arranged in heat-processing device 20 along the longitudinal axis thereof in this order, as shown in FIG. 2.

Unit 21 for loading and unloading boat 40 into and out of process tube 51 is arranged at the front side of heat-processing device 20.

Heat-processing furnace 50 having process tube 51 enclosed by heater 52 is arranged at the rear side of heat-processing device 20. Process tube 51 has gas passage 53 at its bottom. This gas passage 53 is communicated with process and nitrogen gases supply sources (not shown). A switching valve is interposed between the both supply sources and gas passage 53 to appropriately switch the gas, which is supplied from one of the supply sources to process tube 51, from process gas to nitrogen gas and vice versa.

Scavenger 60 is arranged between heat-processing furnace 50 and loading/unloading unit 21 and it is provided with exhaust opening 60a through which gas in scavenger 60 is exhausted.

The front portion of process tube 51 is located in scavenger 60 and process tube 51 is provided with shutter 61 which opens and closes a front opening of process tube 51. The front portion of process tube 51 has receiving portion 55 which is located on the front side of shutter 61. Receiving portion 55 serves to smoothly receive the purge tube formed of arm 30 and boat 40. A soft landing section of loading/ unloading unit 21 has arm 30 for supporting and carrying boat 40. The soft landing section includes carrier arm 30 which serves as a fork made of quartz, an X axis driver system for sliding carrier arm 30 along its longitudinal axis, and Z axis driver system for moving carrier arm 30 up and down.

Figure 3:
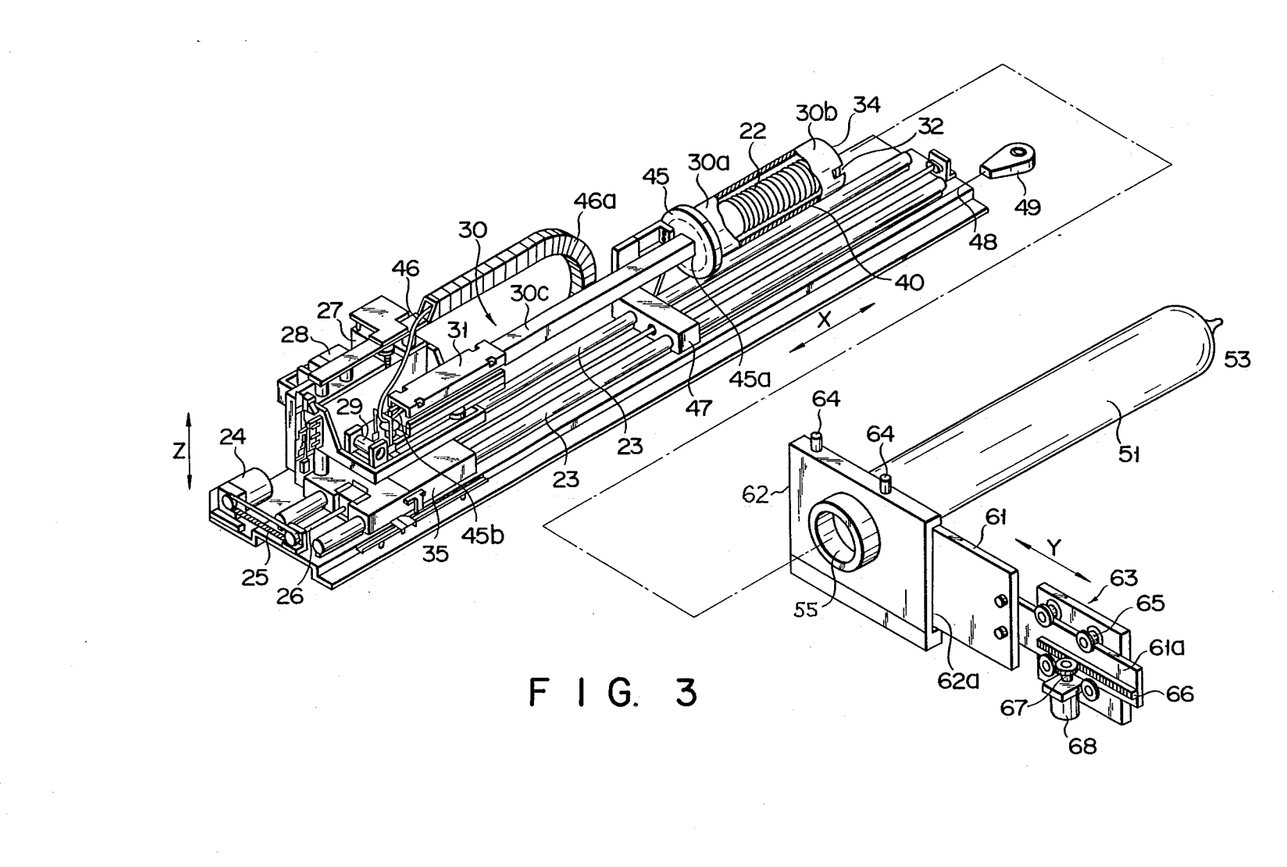
FIG. 3 is a perspective view showing an inside arrangement of the heat process device according to the present invention.

As shown in FIG. 3, carrier arm 30 is made cylindrical at its free end while it has rod-like portion 30c at its fixed end, said rod-like portion being fixed to arm holder means 31.

Figure 4:
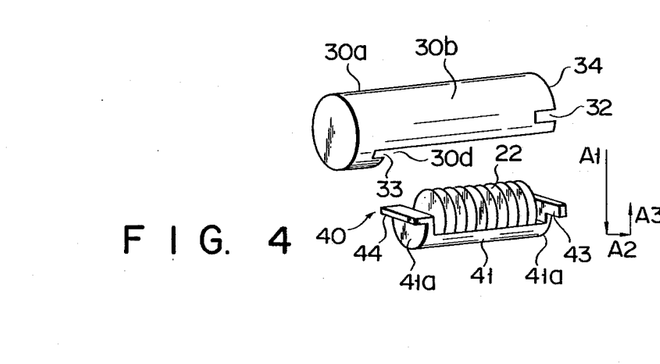
FIG. 4 is a perspective view showing an arc-like lower half of a wafer boat and an arc-like upper half of a carrier arm.

As shown in FIG. 4, carrier arm 30 has hollow cylindrical member 30a and arc member 30b which is an upper half of a hollow cylinder obtained when the cylinder is split along the longitudinal center axis thereof. Engaging slits 32 are provided at the front end of arc member 30b. Other engaging slits 33 are also provided, extending along both longitudinal bottom rims of arc member 30 into hollow cylindrical member 30a.

When boat 40 is supported by arc member 30b of carrier arm 30, boat 40 cooperates with carrier arm 30 to form a hollow cylinder, as shown in FIG. 4. Boat 40 includes arc member 41 which is a lower half of a hollow cylinder obtained when the cylinder is split along the longitudinal center axis thereof. Two support rods (not shown) are bridged between end plates 41a of boat 40. A plurality of grooves are formed on each of the support rods at a certain pitch and semiconductor wafers 22 are held on the support rods with their rims fitted into the grooves.

Paired end plates 41a of boat 40 are provided with projections 43 and 44 which are engaged with the engaging slits 32 and 33 of carrier arm 30.

The X and Z axes driver systems for driving carrier arm 30 will be described with reference to FIG. 3.

Carrier arm 30 is fixed onto base 35 which is movable along a pair of guide rails 23. Movable base 35 is connected to shaft 26 and belt 25 is stretched between a pulley of shaft 26 and a driving shaft of motor 24. A system (not shown) for changing rotary motion to linear motion is housed in movable base 35. When the rotating force of motor 24 is transmitted to shaft 26, therefore, movable base 35 is moved in the longitudinal direction of carrier arm 30 to insert the front end of carrier arm 30 into process tube 51.

A driving shaft of second motor 27 is connected to carrier arm 30 through a gear box (not shown). The rotating force of second motor 27 is changed by the gear box to move carrier arm 30 up and down.

A driving shaft of third motor 28 is connected to cam 29, which is thus rotated. When cam 29 is rotated, carrier arm 30 is positioned to align with the furnace core of process tube 51 in level. The base end of rod-like member 30c is pressed onto base 35 by means of press member, so that carrier arm 30 can be supported like a cantilever.

Shielding plate 45 is made like a disk having such a size as close the open ends of process tube 51 and cylindrical member 30a. Shielding plate 45 has cut-away portion 456a through which rod-like portion 30c of carrier arm 30 can be passed. Gas inlet 45b through which nitrogen gas is introduced into cylindrical member 30a is formed in shielding plate 45 and gas supply tube 46 is connected to gas inlet 45b.

Further, shielding plate 45 is supported by movable member 47, which is connected to one end of wire 48 while the other end of wire 48 to winding means 49. Winding means 49 is fixed on the side of heat-processing furnace 50, pulling wire 48 in its winding direction. Shielding plate 45 which is pulled by wire 48, as described above, is pressed against one end face of cylindrical member 30a at the front end of carrier arm 30.

Rod-like member 30c is made hollow and the front end of gas supply tube 46 is inserted into this hollow portion in rod-like member 30c. Gas supply tube 46 is flexible and its portion extending from the nitrogen gas supply source (not shown) to round gas inlet 45b (or base end of rod-like member 30c) is protected by protection guide 46.

Scavenger 60 is separated from loading/unloading unit 21 and heat-processing furnace 50 by partition 60b and 60c. Partition 60b located at the front side of scavenger 60 is provided with an opening, through which the front end of carrier arm 30 is inserted into scavenger 60. Scavenger 60 is communicated with a suction opening of the exhaust means (not shown) through exhaust pipe 60a.

Guide member 62 for shutter 61 is arranged adjacent to the opening of process tube 51. Guide member 62 is a rectangular casing in which guide groove 62a is formed to guide shutter 61 into and out of the casing. Plural gas supply openings 64 are formed on the top of guide member 62. These gas supply openings 64 are intended to guide nitrogen gas, which is supplied from the nitrogen gas supply source (not shown), into guide member 62.

Flow rate switching valve or gas pressure adjusting valve is attached to each of the gas supply sources to adjust the flow rate of gas which flows into the purge tube, which is formed by boat 40 and upper arc member 30a, and process tube through gas inlets 45b, 53 and 64.

Driver system for shutter 61 includes driven plate 61a connected to shutter 61, two pairs of guide rollers 65 for supporting driven plate 61a movable along Y axis, rack 66 on one side of driven plate 61a, and motor 68 having pinion 67 engaged with rack 66 and attached to its driving shaft. Driven plate 61a is held between two pairs of rollers 64. Each of those parts which form system 63 for driving shutter 61 is made of such material that creates no dust, stainless steel is employed, for example.

A method of heat-processing semiconductor wafers 22 by means of above-described heat-processing device 20 will be described referring to FIGS. 5A through 5J.

Figure 5A:
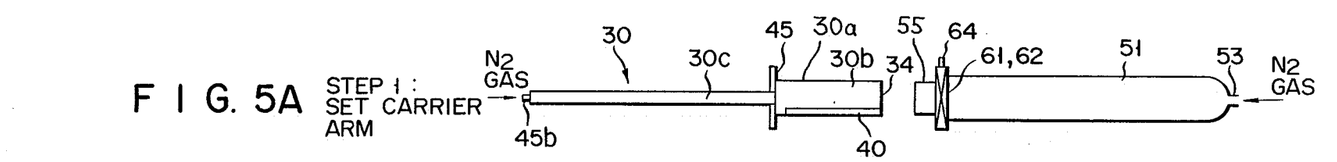
FIGS. 5A through 5J are vertically sectioned views intended to explain each step of a heat processing method according to the present invention.

A predetermined pieces of semiconductor wafers 22 are mounted on boat 40 at a predetermined pitch. Carrier arm 30 is moved in X axis direction and set at a predetermined home position (step 1). Shielding plate 45 is pressed this time against one end face of cylindrical member 30a of carrier arm 30 by means of wire 28.

Figure 5B:
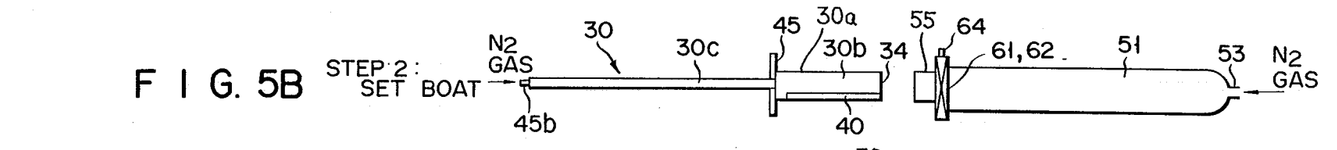

Carrier arm 30 is moved (or lowered, moved along X axis and lifted), following arrows $A_1$–$A_3$ in FIG. 4. Slits 32 and 33 are engaged with projections 43 and 44 of boat 40, so that upper arc member 30b can be assembled with boat 40 to form the purge tube (step 2). Shutter 61 is kept closed this time. The amount of nitrogen gas supplied through gas inlet 45b is switched "large" and when nitrogen gas supplied through one end of cylindrical member 30a is exhausted through the other open end thereof, gas such as air is exhausted from the purge tube. The hollow portion in rod-like member 30c of carrier arm 30 may be used in this case as the passage through which nitrogen gas is exhausted.

Figure 5C:
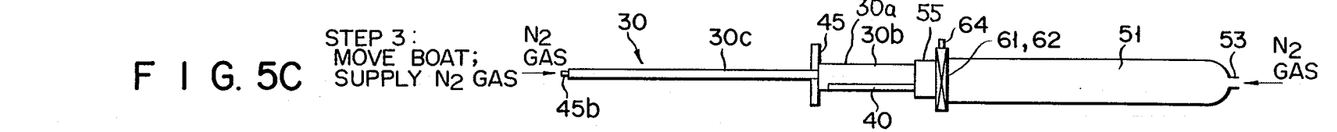

As shown in FIG. 5C, carrier arm 30 is moved toward process tube 51 in X axis direction when first motor 24 is made operative. Cylindrical member 30a is thus forwarded and shielded plate 45 which is pressed against cylindrical member 30a by wire 48 is also forwarded toward process tube 51 together with movable member 47 and carrier arm 30. The distal end portion of cylindrical member 30a is inserted into receiving portion 55. This forwarding movement continues until the open end 34 of carrier arm 30 strikes against shutter 61. The flow rate of nitrogen gas supplied through gas inlet 45b is switched "larged" this time, as described above. Nitrogen gas supplied through gas inlet 45b thus flows to shutter 61, accompanying air in the purge tube, and escapes outside the line through guide groove 62a of shutter 61 or clearance between the purge tube and shutter 61 (step 3).

When the purge tube which is formed by upper arc member 30b and boat 40 is filled with nitrogen gas in this manner, keeping shutter 61 closed, air is prevented from entering into the purge tube through open end 34 and also into process tube 51.

Figure 5D:
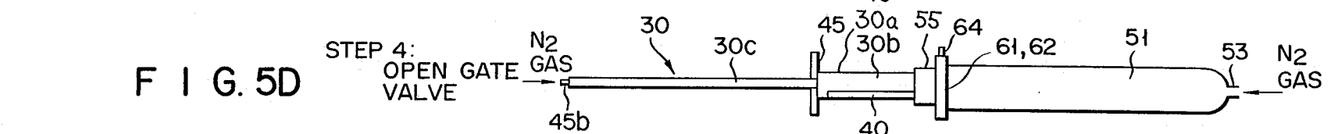

As shown in FIG. 5D, shutter 61 is retreated from guide member 62 to communicate the purge tube with process tube 51 through opening 62b (step 4). The supply of nitrogen gas into the purge tube is being continued this time through gas inlet 45b while a large amount of nitrogen gas, 10 liter per minute, for example, is also supplied into process tube 51 through supply inlet 53 at one end thereof. Nitrogen gas, air and the like introduced into the line through gas inlets 45b and 53 of the purge and process tube are discharged outside the line through guide groove 62a of guide member 62 and clearance between open end 24 of the purge tube and shutter 61, gathered in scavenger 60 and exhausted outside through exhaust opening 60a.

Figure 5E:
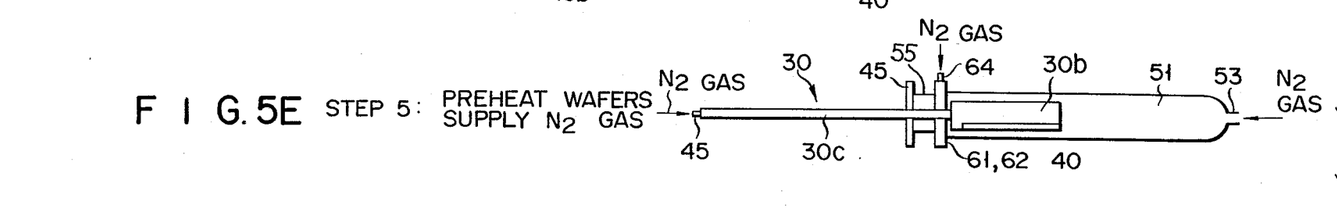

As shown in FIG. 5E, carrier arm 30 is further forwarded to insert the purge tube or boat 40 into the front portion of process tube 51 and pre-heat the purge tube or boat 40 to a predetermined temperature or 400° C., for example. Semiconductor wafers 22 can be pre-heated to a range of 300°-800° C. in this case. Nitrogen gas is supplied into process tube 51 through supply openings 64 on the top of guide member 62 at a flow rate of 5 liter per minute, for example. This enables both of the tubes to be filled with nitrogen gas, so that undesirable gas such as air can be prevented from entering into the line before semiconductor wafers 22 on boat 40 carried into heat-processing furnace 50 (step 5). When boat 40 is completely carried into process tube 51, shielding plate 45 contacted with the end face of cylindrical member 30a, which supports boat 40, reaches the open end of process tube 51 and closes it. The amount of heat discharged through the open end of process tube 51 can be reduced accordingly and temperature in process tube 51 can be less lowered.

Figure 5F:
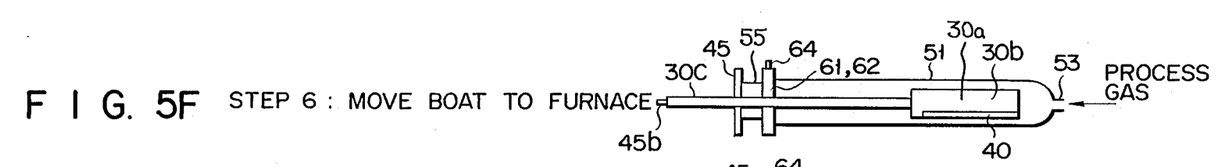

As shown in FIG. 5F, carrier arm 30 is still further forwarded to carry wafers on boat 40 to the furnace core of process tube 51 (step 6). When boat 40 reaches the furnace core of process tube 51, the switching valve at the gas supply source is switched from nitrogen gas supply to process gas supply to supply a predetermined amount of process gas into process tube 51 through gas supply opening 53.

Figure 5G:
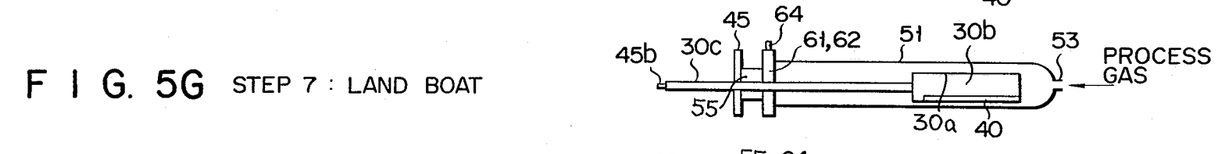

As shown in FIG. 5G, carrier arm 30 is lowered or swung by the soft landing means to land boat 40 soft in process tube 51 (step 7). Carrier arm 30 is retreated a little against wire 48 to release member 30b from boat 40. As the result, boat 40 is left, landing soft in process tube 51.

Figure 5H:
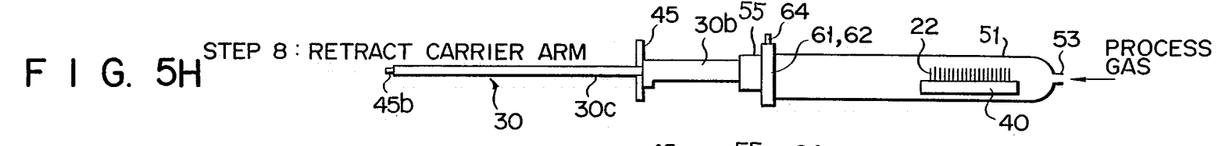

Carrier arm 30 is further retreated with its front end coming out of process tube 51 (step 8), as shown in FIG. 5H.

Figure 5I:
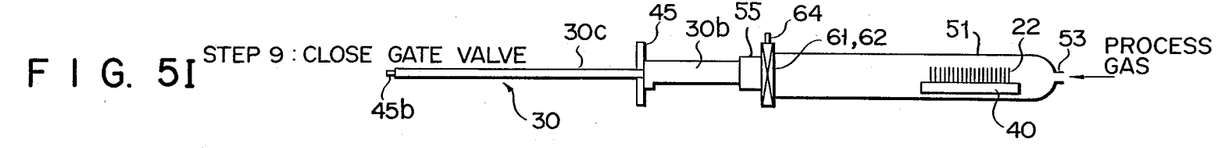

Shutter 61 is then closed (step 9), as shown in FIG. 5I.

Figure 5J:
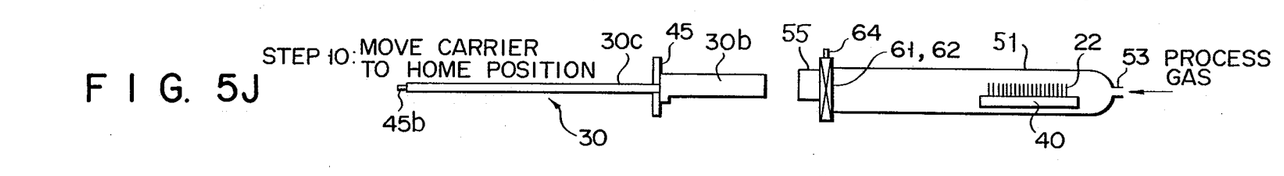

As shown in FIG. 5J, carrier arm 30 is set in the home position and heat process is started in process tube 51 (step 10).

In the course of this heat process which includes no annealing step, film-forming process gas is supplied into process tube 51 at a flow rate of 10 to 50 liter per minute and semiconductor wafers 22 are processes for 30 minutes in the atmosphere of this process gas and at a temperature range of 900°-1200° C. A film of $SiO_2$, 5000 to 10000 Å thick, is thus formed on the surface of each of semiconductor wafers 22.

When this reaction process is finished, above-described steps 1-10 are to be reversely conducted, starting from step 10 and ending with step 1, to carry boat 40 out of process tube 51.

When boat 40 which has been heated to high temperature is put immediately out of the line in the course of conducting step 5, step 4 and then step 3, semiconductor wafers 22 are oxidized forming undesirable oxide film on each of the wafers.

In order to prevent wafers 22 from being oxidized, the flow rate adjusting valve is made operative to increase the flow rate of nitrogen gas, introducing a large amount of nitrogen gas into the line, which comprises purge and process tubes, through gas inlets 45b and 53 only for several minutes to cool semiconductor wafers 22 with gas to a temperature of about 400° C., while steps 5 and then 4 are being conducted. It is set in this case that the amount of nitrogen gas introduced into the line through gas inlet 45b is 10 liter per minute and that the amount of nitrogen gas introduced into the line through gas inlet 53 is 10 liter per minute. Nitrogen gas introduced is common in temperature. Semiconductor wafers 22 in the purge tube are not oxidized but cooled enough and even when the purge tube is released from process tube 51 with shutter 61 being closed and then put out of the line, therefore, wafers 22 are not oxidized. After shutter 61 is closed, the valve is operated to the flow rate of nitrogen gas introduced through gas inlet 45b to 5 liter per minute.

Carrier arm 30 is set at its home position and boat 40 is released from carrier arm 30 (step 1). One cycle of the heat process is thus finished.

According to the first embodiment of the present invention as described above, the purge tube which comprises carrier arm 30 and boat 40 is filled with nitrogen gas at all times when boat 40 is loaded into and unloaded from process tube 51. This can prevent air and the like from entering into the heat process line to effectively stop the oxidation of semiconductor conductor wafers 22.

The passage of boat 40 can be closed by shielding plate 45 and shutter 61 particularly in the course of purging nitrogen gas. This can almost completely prevent air from entering into the process line, so that the productivity of semiconductor wafers can be enhanced to a great extent in the film-forming process.

Second through fifth examples of the front end of the carrier arm and the boat will be described with reference to FIGS. 6 through 13.

Figure 6:
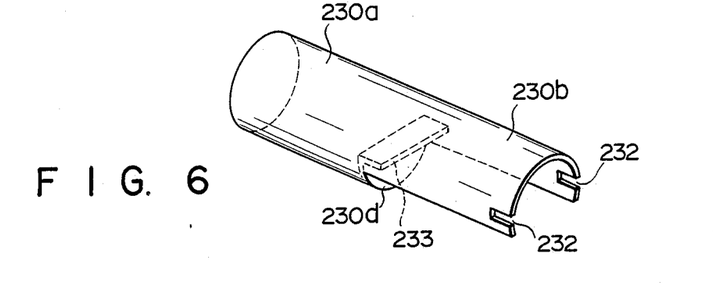
FIGS. 6 through 9 are perspective views showing second through fifth examples of the carrier arm for carrying boats.

FIG. 6 shows a second example of the front end of the carrier arm. The front end of the carrier arm comprises hollow cylindrical member 230a and upper arc member 230b and semi-circular partition 230d is located between members 230a and 230b. A pair of key grooves 232 are formed at the front end of upper arc member 230b and plate-like projection 233 is horizontally projected from the top of semi-circular partition 230d.

Figure 10:
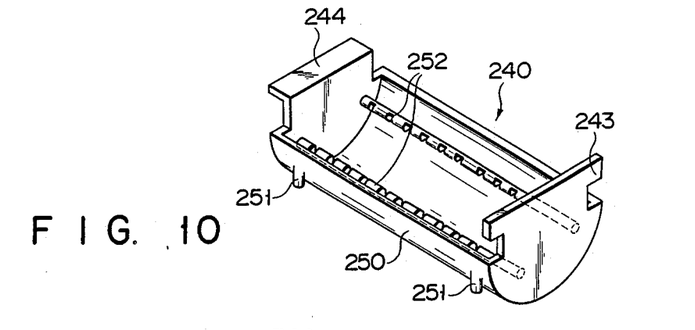
FIGS. 10 through 13 are perspective views showing second through fifth examples of the heat process boat.

FIG. 10 shows a second example of the boat. Boat 240 includes lower arc member 250, a pair of wafers support rods 252 extending along the longitudinal axis of member 250, and two paris of legs 251. Both end plates of member 250 are provided with first and second engaged pieces 243 and 244. First engaged piece 243 is shaped like a pair of projections projected in the width direction of boat 240 while second engaged piece 244 is a plate-like projection similar to plate-like projection of the carrier arm but projected opposite to the latter.

Figure 7:
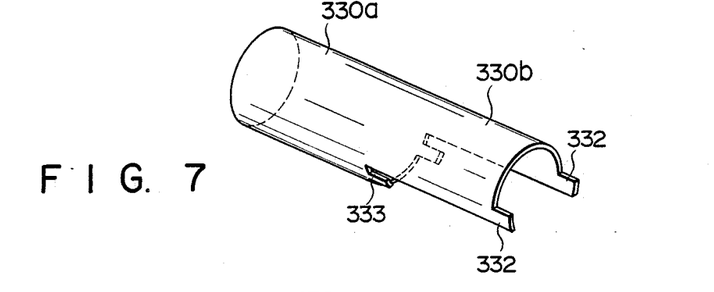

FIG. 7 shows a third example of the front end of the carrier arm. The front end of the carrier arm comprises hollow cylindrical member 330a and upper arc member 330b. A pair of projections 332 are formed at the front end of upper arc member 330b. A pair of slits 333 extend into hollow cylindrical member 330a along the longitudinal bottom sides of upper arc member 330b.

Figure 11:
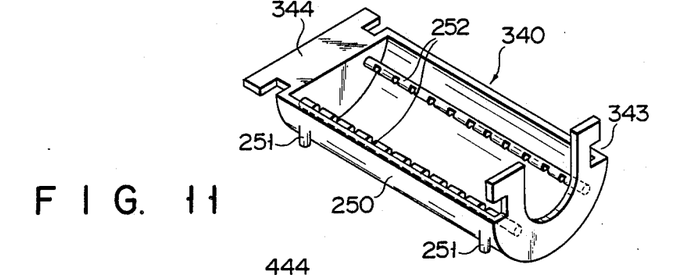

FIG. 11 shows a third example of the boat. Boat 340 includes lower arc member 250, a pair of wafers support rods 252 extending along the longitudinal axis of member 250, and two paris of legs 251. Both end plates of member 250 are provided with first and second engaged pieces 343 and 344. First engaged piece 343 is shaped like a pair of slits formed on both sides of the boat. Second engaged piece 344 is a plate projected in the longitudinal direction of the boat and fitted into key-groove-like slits 333 of the carrier arm.

Figure 8:
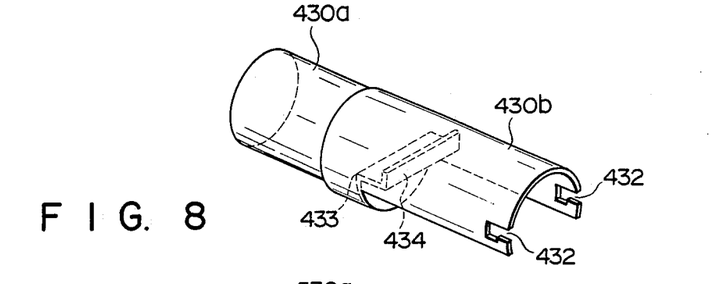

FIG. 8 shows a fourth example of the front end of the carrier arm. The front end of the carrier arm comprises hollow cylindrical member 430a and upper arc member 430b wherein the front of member 430a is fitted into the rear end of member 430b. A pair of key-groove-like slits 432 are formed at the front end of upper arc member 430b. Plate 433 is projected from the top of partition between members 430a and 430b with its front end bent upward to form hook 434.

Figure 12:
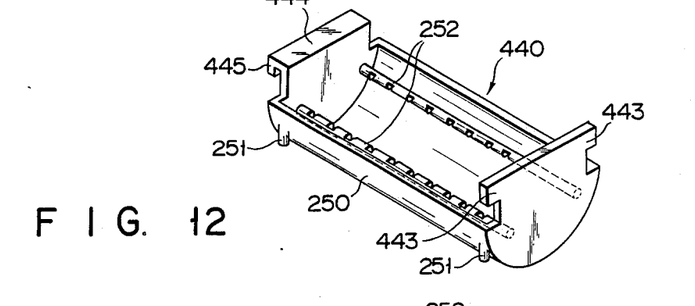

FIG. 12 shows a fourth example of the boat. Boat 440 includes lower arc member 250, a pair of wafers support rods 252 extending in the longitudinal direction of member 250, and two paris of legs 251. Both end plates of member 250 are provided with first and second engaged pieces 443 and 444. First engaged piece 443 is shaped like a pair of protrusions projected in the width direction of the boat. Second engaged piece 444 is a plate-like protrusion having hook 445, which is engaged with hook 434 of the carrier arm.

Figure 9:
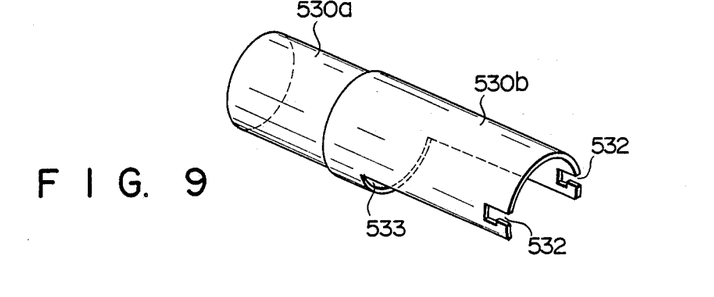

FIG. 9 shows a fifth example of the front end of the carrier arm. The front end of the carrier arm includes hollow cylindrical member 530a and upper arc member 530b wherein the front end of member 530a is fitted into the rear end of member 530b. A pair of key-groove-like slits 532 are formed at the front end of upper arc member 530b. No specific engaging member or piece such as projections and slits is provided between members 530a and 530b where the front end of member 530a is fitted into the rear end of member 530b. This is because engaged piece 544 of boat 540 which will be described later is designed to fit into the front end of member 530a.

Figure 13:
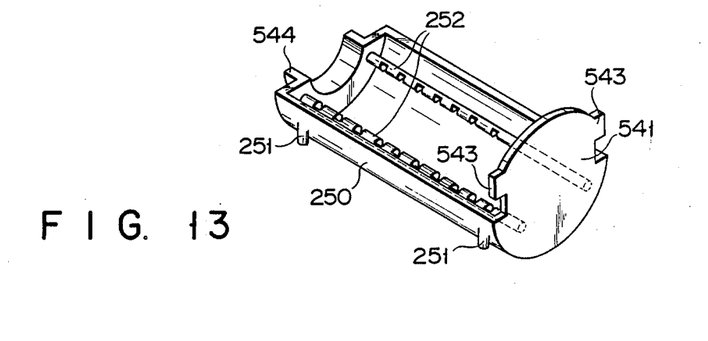

FIG. 13 shows a fifth example of the boat. Boat 540 includes lower arc member 250, a pair of wafers support rods 252 extending in the longitudinal direction of member 250, and two pairs of legs 251. End plate 541 of member 250 is provided with first engaged piece 543 while second engaged piece 544 is formed at the other end of member 250. First engaged piece 543 is shaped like a pair of projections extending in the width direction of the boat. Second engaged piece 544 is made to have a diameter smaller than that of member 250. This second engaged piece 544 is designed to fit into the front end of member 530a which has been fitted into the rear end of member 530b.

It should be understood that the present invention is not limited to the above-described embodiments and that various changes and modifications can be made without departing from the scope and spirit of the present invention.

Although the present invention has been described on its embodiments applied to the horizontal multideck furnaces, it may be applied to the vertical multideck furnaces.

Before or after the heat process, the method of the present invention may include at least a step of communicating the purge tube, which comprises the carrier arm and the boat, with the process tube, a step of supplying non-oxidizable gas into the purge tube to enclose wafers with an atmosphere of this non-oxidizable gas, and a step of pre-heating or cooling the wafers to a predetermined temperature. It is not necessarily needed, therefore, that nitrogen gas is purged with shutter 61 closed, as described in the case of the above-mentioned embodiment. In a case where no shutter is provided, the open end of the process tube may be closed by shielding plate 45. When the boat is carried into the process tube, the open end of the process tube can be faster closed by shielding plate 45 in this case.

However, it is preferable that the heat process device is provided with shutter 61, because, when nitrogen gas is purged at step 3 as described above, air and the like can be exhausted outside with higher reliability and prevented from entering into heat process furnace 50. Shielding plate 45 of the present invention is excellent in such a simple construction that enables it to be moved together with carrier arm 30, urging it against the rear end of boat 40 but without using any specific driver source. However, it may be independently driven by a different driver source.

It is not necessarily needed that the step of purging non-oxidizable gas is conducted before and after the heat process. Even when it is conducted either before or after the heat process, some effect can be attained. It is more preferable in this case from the viewpoint of stopping the oxidation of the wafers that non-oxidizable gas is purged before the boat is carried into the process tube.

According to the present invention, unnecessary gas such as air present in the space enclosing the wafers-mounted boat and in the heat process furnace can be exhausted outside and these spaces can be filled with an atmosphere of non-oxidizable gas before and after or either before or after the heat process to reliably prevent undesirable oxide film and the like from being formed on the surface of each of the semiconductor wafers.

Further, the boat itself can be used as a part of the means for enclosing the wafers and this enables the wafers to be efficiently prevented from becoming oxidized when the boat is loaded into and unloaded from the process tube. It was needed in the case of the conventional atom scanning that the boat had its moving stroke, and this made the space which the device exclusively occupied large and the installing of the device in a clean room disadvantageous. According to the method and device of the present invention, however, the space which the device exclusively occupies in the room can be made smaller.

What is claimed is:

1. A method of heat-processing objects comprising:
   forming a purge tube means which encloses the objects by supporting a boat means, on which the plural objects are mounted, by a carrier arm means to define a space on the upper side of the objects while defining another space on the lower side of the objects when the boat means is to be loaded into and unloaded from a heat process furnace means by the moving carrier arm means or either when the boat means is to be loaded into the heat process furnace means or when it is to be unloaded from the heat process furnace means,
   moving the carrier arm means to communicate the purge tube means with the heat process furnace means,
   supplying non-oxidizable gas into both of the purge tube means and the heat process furnace means, keeping them connected to each other,
   pre-heating or cooling the objects to a predetermined temperature range, and
   loading the purge tube means into the heat process furnace means or unloading the purge tube means from the heat process furnace means.

2. The heat process method according to claim 1, whereby non-oxidizable gas is supplied into the purge tube means and the heat process furnace means which are connected to each other, only before the objects in the purge tube means is heat-processed.

3. The heat process method according to claim 1, whereby non-oxidizable gas is supplied into the purge tube means and the heat process furnace means which are connected to each other, only after the objects in the purge tube means is heat-processed.

4. A method of heat-processing objects comprising:
   forming a purge tube means which encloses the objects by supporting a boat means, on which the plural objects are mounted, the boat means is to be loaded into and unloaded from a heat process furnace means by a moving carrier arm means or either when the boat means is to be loaded into the heat process furnace means or when it is to be unloaded from the heat process furnace means;
   shutting said heat process furnace means and said purge tube means by a shutter means, which is provided at a front portion of the heat process furnace means;
   moving the carrier arm means to communicate the purge tube means with the front portion of the heat process furnace means;
   supplying non-oxidizable gas into both of the purge tube means and the shutter means;
   pre-heating or cooling the objects to a predetermined temperature range; and
   loading the purge tube means into the heat process furnace means after communicating the purge tube means and the heat process furnace means by opening the shutter means, or unloading the purge tube means from the heat process furnace means.

5. A method of heat-processing objects according to claim 4, wherein said purge tube means is made to communicate with a receiving means, which is provided at an end of the heat process furnace means, said receiving means projecting forward from the shutter means.

* * * * *